(12) United States Patent
Chaichanavong et al.

(10) Patent No.: US 9,203,429 B1
(45) Date of Patent: Dec. 1, 2015

(54) SYSTEMS AND METHODS FOR USING MARKOV DISTRIBUTION CODES IN DATA STORAGE SYSTEMS

(71) Applicant: Marvell International Ltd., Hamilton (BM)

(72) Inventors: Panu Chaichanavong, Bangkok (TH); Nedeljko Varnica, San Jose, CA (US); Nitin Nangare, Santa Clara, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 0 days.

(21) Appl. No.: 14/629,750

(22) Filed: Feb. 24, 2015

Related U.S. Application Data

(60) Provisional application No. 61/948,349, filed on Mar. 5, 2014, provisional application No. 61/943,964, filed on Feb. 24, 2014.

(51) Int. Cl.
H03M 7/00 (2006.01)
H03M 7/30 (2006.01)

(52) U.S. Cl.
CPC .............. *H03M 7/30* (2013.01); *H03M 7/3059* (2013.01); *H03M 7/3071* (2013.01); *H03M 7/3079* (2013.01); *H03M 7/3084* (2013.01)

(58) Field of Classification Search
CPC ... H03M 7/30; H03M 7/3059; H03M 7/3071; H03M 7/3079; H03M 7/3084
USPC .......................................................... 341/107
See application file for complete search history.

(56) References Cited

U.S. PATENT DOCUMENTS 5,987,182 A * 11/1999 Kimura et al. ................ 382/239
6,031,938 A * 2/2000 Kajiwara ...................... 382/239
7,319,417 B2 * 1/2008 Wu et al. ....................... 341/107

* cited by examiner

*Primary Examiner* — Brian Young

(57) ABSTRACT

Systems and methods are provided for encoding information using a code specified by a target Markov distribution. The systems and methods include selecting a set of parameters comprising a block length, a plurality of weight metrics, and a threshold, and estimating a Markov distribution associated with the selected set of parameters from a plurality of data blocks defined by the selected parameters. The systems and methods further include modifying the set of parameters based on the estimated Markov distribution, and encoding the information using the modified set of parameters.

20 Claims, 11 Drawing Sheets

SYSTEMS AND METHODS FOR USING MARKOV DISTRIBUTION CODES IN DATA STORAGE SYSTEMS

CROSS-REFERENCE TO RELATED APPLICATIONS

This disclosure claims the benefit under 35 U.S.C. §119(e) of U.S. Provisional Application No. 61/943,964, filed on Feb. 24, 2014, and of U.S. Provisional Application No. 61/948,349, filed on Mar. 5, 2014, both of which are hereby incorporated by reference herein in their respective entireties.

FIELD OF USE

The present disclosure relates generally to error correcting systems and methods and, more particularly, to the design, optimization, and implementation of Markov distribution codes.

BACKGROUND OF THE DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

In some systems, the performance achieved by error correcting codes may depend on the actual bit sequences or bit patterns of the codeword. For example, the error correcting performance for a first bit pattern, such as "010101," may be statistically worse than the error correcting performance for a second bit pattern, such as "000000" or "111111." In data storage systems, for instance, error correcting performance may decrease with the number of transitions (e.g., transitions from logical one to logical zero or vice versa) due to properties of the magnetic recording medium that make such transitions more prone to errors. In other words, in these systems, bit patterns with a large number of transitions may be more prone to errors than sequences with a smaller number of transitions.

In systems that exhibit such properties, error correction performance can be improved by constructing constraint codes and error correction codes (ECCs) that prevent bit patterns with a large number of transitions from occurring in the encoded data. For ease of exposition, we will sometimes refer to constraint codes and/or error correction codes as codes in the remainder of the descriptions. A specific example of constraint codes are Maximum Transition Run (MTR) codes, which are designed to completely eliminate specific transition patterns. While the avoidance of these specific patterns helps to improve the error correction performance, the use of such codes reduces the code rate, because the excluded patterns are no longer available for encoding. From an overall performance perspective, MTR codes may therefore suffer a performance loss in some scenarios.

SUMMARY OF THE DISCLOSURE

In accordance with an embodiment of the present disclosure, a method is provided for encoding information using a code specified by a target Markov distribution. The method includes selecting a set of parameters comprising a block length, a plurality of weight metrics, and a threshold, and estimating a Markov distribution associated with the selected set of parameters from a plurality of data blocks defined by the selected parameters. The method further includes modifying the set of parameters based on the estimated Markov distribution, and encoding the information using the modified set of parameters.

In some implementations, the method includes determining the set of parameters iteratively by repeatedly estimating a Markov distribution associated with the modified set of parameters and modifying the set of parameters based on the estimated Markov distribution.

In some implementations, encoding the information using the modified set of parameters includes generating a trellis having a plurality of states based on the modified set of parameters, and encoding the information using an enumerative code determined from the trellis.

In some implementations, modifying the set of parameters based on the estimated Markov distribution includes modifying the set of parameters to approximate the target Markov distribution.

In some implementations, the target Markov distribution is specified by a plurality of probabilities, and at least one of the plurality of probabilities corresponds to a hard constraint. The method further includes generating the plurality of data blocks such that each of the plurality of data blocks satisfies the hard constraint.

In accordance with an embodiment of the present disclosure, a system is provided for encoding information using a code specified by a target Markov distribution. The system includes storage circuitry configured to store a set of parameters comprising a block length, a plurality of weight metrics, and a threshold. The system further includes control circuitry configured to estimate a Markov distribution associated with the selected set of parameters from a plurality of data blocks defined by the selected parameters, and modify the set of parameters based on the estimated Markov distribution. The control circuitry is further configured to encode the information using the modified set of parameters.

In some implementations, the control circuitry is further configured to determine the set of parameters iteratively by repeatedly estimating a Markov distribution associated with the modified set of parameters and modifying the set of parameters based on the estimated Markov distribution.

In some implementations, the control circuitry encodes the information using the modified set of parameters by being further configured to generate a trellis having a plurality of states based on the modified set of parameters, and encode the information using an enumerative code determined from the trellis.

In some implementations, modifying the set of parameters based on the estimated Markov distribution includes modifying the set of parameters to approximate the target Markov distribution.

In some implementations, the target Markov distribution is specified by a plurality of probabilities, at least one of the plurality of probabilities corresponds to a hard constraint, and the control circuitry is further configured to generate the plurality of data blocks such that each of the plurality of data blocks satisfies the hard constraint.

In accordance with an embodiment of the present disclosure, a method is provided for determining a Markov distribution code for use in a decoding system. The method includes modifying, using control circuitry, at least one probability value of a first Markov distribution to obtain a second Markov distribution, and computing a performance metric for a code specified by the second Markov distribution based on properties of the decoding system. The method further includes comparing the performance metric of the code specified by the second Markov distribution with a performance metric of a code specified by the first Markov distribution, and replacing the first Markov distribution with the second Markov distribution when the performance metric of the code specified by the second Markov distribution exceeds the performance metric of the code specified by the first Markov distribution.

In some implementations, the method further includes repeating the modifying, the computing, the comparing, and the replacing until a convergence criterion is satisfied.

In some implementations, the performance metric corresponds to one or more values of an extrinsic information transfer function.

In some implementations, the performance metric is associated with a shape of an extrinsic information transfer function.

In some implementations, the first Markov distribution is associated with a code rate, and modifying the at least one probability value includes modifying the at least one probability value such that a code rate of the second Markov distribution remains equal to the code rate associated with the first Markov distribution.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION

Figure 1:
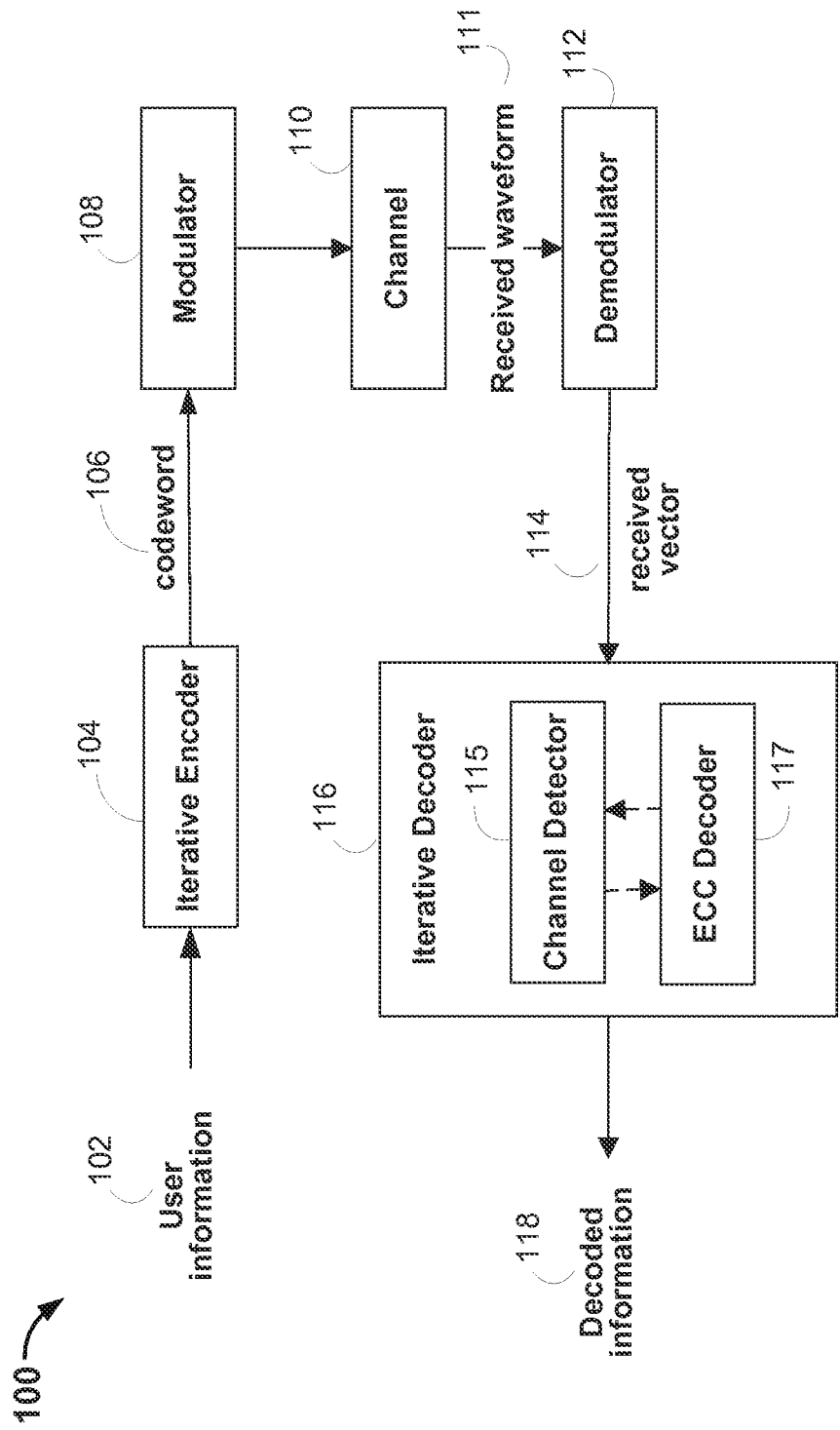
FIG. 1 shows an illustrative communication or data storage system that utilizes error correction codes to achieve reliable communication or storage in accordance with some embodiments of the present disclosure.

FIG. 1 shows an illustrative communication or data storage system 100 that utilizes error correcting codes, such as LDPC codes, to achieve reliable communication or storage, in accordance with some embodiments of the present disclosure. User information 102 is encoded through iterative encoder 104. User information 102 may be referred to as the message information or a message vector, and may be grouped into units of k symbols. Each symbol may be viewed as an element of a Galois Field (GF) with a certain order. For example, a Galois Field with order two may correspond to binary symbols. The result of encoding user information 102 is codeword 106. Codeword 106 may be of a predetermined length.

In some embodiments, codeword 106 is passed to a modulator 108. Modulator 108 prepares codeword 106 for transmission across channel 110. Modulator 108 may use phase-shift keying, frequency-shift keying, quadrature amplitude modulation, or any suitable modulation technique to modulate codeword 106 into one or more information carrying signals. Channel 110 may represent media through which the information carrying signals travel. For example, channel 110 may represent a wired or wireless medium in a communication system, or a storage medium in which the information-carrying signals may be stored. The storage medium may be an electronic (e.g., RAM, ROM), magnetic (e.g., a hard disk), or optical (e.g., CD, DVD, or holographic) storage medium.

Due to interference from other signals or other types of noise and phenomena, channel 110 may corrupt the waveform transmitted by modulator 108. Thus, the waveform received by demodulator 112, i.e., received waveform 111, may be different from the originally-transmitted signal waveform. Received waveform 111 may be demodulated with demodulator 112. Demodulator 112 may demodulate received waveform 111 with filters, multiplication by periodic functions, or any suitable demodulation technique corresponding to the type of modulation used in modulator 108. The result of demodulation is received vector 114, which may contain errors due to channel corruption.

Received vector 114 corresponding to codeword 106 may then be processed by iterative decoder 116. Iterative decoder 116 may be used to correct or detect errors in received vector 114. In some embodiments, iterative decoder 116 may include a channel detector 115 and an ECC decoder 117. Channel detector 115 may be implemented using a Soft-Output Viterbi Algorithm (SOVA) detector. Iterative decoder 116 may use an iterative message passing algorithm to correct or detect errors in received vector 114 in order to output decoded information 118.

A channel iteration refers to an iteration between a channel detector and an ECC decoder (e.g., an LDPC decoder). For example, a channel iteration may refer to repeated instances of information passing between channel detector 115 and ECC decoder 117. In contrast, an ECC iteration may refer to iterations within the ECC decoder (e.g., a flooding decoder or layered decoder), for example, repetition of calculations within ECC decoder 117. The ECC decoder generally processes symbols of received vector 114 multiple times within a channel iteration. For example, the ECC decoder may process all symbols of the codeword five or more times within a channel iteration. In contrast, the channel detector may typically process each symbol of received codeword 114 only once during a channel iteration.

Figure 2:
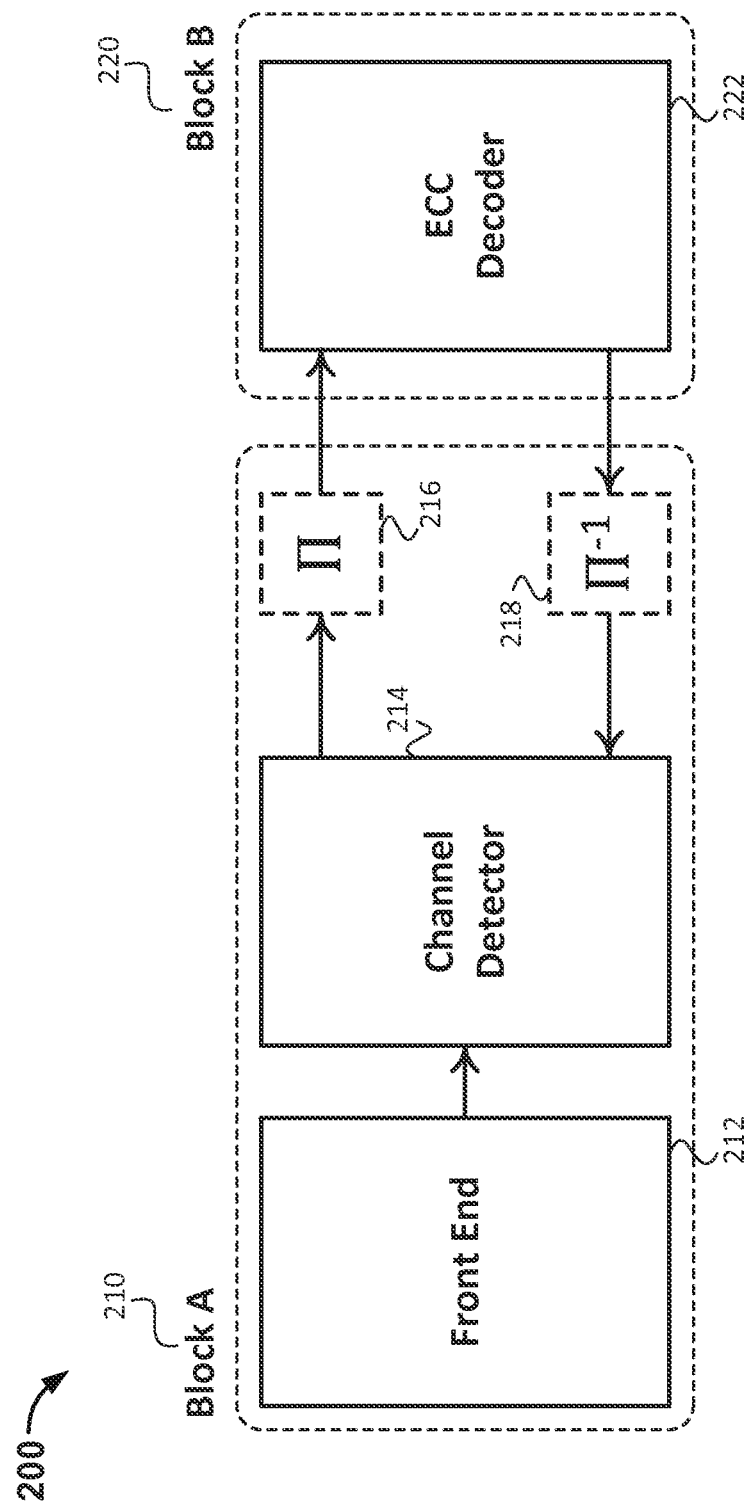
FIG. 2 shows an illustrative block diagram of an iterative decoding system, in accordance with some embodiments of the present disclosure.

FIG. 2 shows a block diagram of an iterative decoding system 200 that includes a channel detector 214 and an ECC decoder 222, in accordance with some embodiments of the present disclosure. Iterative decoder 200 may be a more detailed representation of iterative decoder 116 of FIG. 1 and may include, in addition to channel detector 214 and ECC decoder 222, an interleaver 216, a deinterlever 218, and a frontend 212. Interleaver 216 and deinterleaver 218 may be optional. As is described in relation to FIG. 1, channel detector 214 and ECC decoder 222 may concurrently process received vector 114 in multiple iterations. Channel detector 214 and ECC decoder 222 may exchange extrinsic information with one another in order to improve decoding performance between iterations.

In some embodiments, the extrinsic information of channel detector 214 may be defined as the additional information provided by the processing of channel detector 202 relative to the information that was provided as input to channel detector 214. Channel detector 214 may process the received vector based on a set of a priori probabilities, wherein each element of the set may correspond to a specific symbol of the received vector (and thus to a specific symbol of the transmitted codeword). This a priori information may be expressed in the form of log-likelihood ratios (LLRs), i.e., each symbol in the received vector may correspond to a specific LLR value. The processing performed by channel detector 214 results in updated LLR values, which are also referred to as a posteriori information. Similar to the a priori information, a posteriori information may be expressed in the form of LLRs. Similar to the channel detector 214, ECC decoder 222 takes a priori information as input to obtain a posteriori information as output.

It is important to note that the channel detector's a priori information may readily be obtained from the ECC decoder's a posteriori information. Likewise, the ECC decoder's a priori information may readily be obtained from the channel detector's a posteriori information. The correspondence is defined by interleaver 216 and deinterleaver 218. Typically, the parameters of the interleaver are known, and thus a priori and a posteriori information may be converted in a straightforward fashion.

In some aspects, iterative encoder 104 and iterative decoder 116 may use codes that are defined based on Markov probabilities. A Markov probability may denote the probability that a given bit position of received vector 114 is equal to logical one, conditioned on a sequence of prior bit positions. For example, the probability that a current bit $a_k$ is equal to logical one may depend on the four previous bits, $a_{k-1}$, $a_{k-2}$, $a_{k-3}$, and $a_{k-4}$. Using this notation, it is possible to formulate constraints such that certain bit sequences are excluded from occurring in the codeword. For example, the exclusion of certain bit sequences in constrained codes may be expressed mathematically by forcing certain Markov probabilities to be equal to one (e.g., to make the corresponding transitions events occur with certainty) while setting other Markov probabilities to zero. For example, the occurrence of the bit sequence "01010" may be prevented by imposing the following constraint for Markov probability P on a code:

$$P(a_k=1|a_{k-4}a_{k-3}a_{k-2}a_{k-1}=0101)=1.$$

In other words, similar to an MTR code, Markov probabilities may be used to enforce "hard" constraints with respect to the occurrence of specific bit sequences.

In some aspects, Markov probabilities may also be used to enforce "soft" constraints with respect to the occurrence of certain bit sequences. Such constraints may by imposed by selecting Markov probabilities that are strictly greater than zero and strictly less than one.

By doing so, a Markov distribution (MD) code can be constructed that controls the frequency with which certain bit sequences occur. In other words, rather than eliminating bit sequences entirely, the occurrence rate of certain bit sequences may be controlled. As a result, of the "soft" rather than "hard" constraints, the impact on the code rate may be reduced, which may improve performance substantially.

Formally, an MD code may be defined through a set of Markov probabilities. A specific Markov probability may be specified for each possible bit sequence of length N, where N corresponds to the Markov memory length. For example, if N=4 is chosen as in the previous example, a Markov probability may be specified for each possible bit sequence of length four.

Mathematically, this can be expressed as:

$$P(a_k=1|a_{k-4}a_{k-3}a_{k-2}a_{k-1}=0000)=p_0$$

$$P(a_k=1|a_{k-4}a_{k-3}a_{k-2}a_{k-1}=0001)=p_1$$

$$P(a_k=1|a_{k-4}a_{k-3}a_{k-2}a_{k-1}=1111)=p_{2^N-1}$$

The entire set of probabilities $p_i$ is referred to as the Markov distribution of the MD code. In some aspects, in order to optimize performance, the distribution of Markov probabilities may need to be carefully optimized to match the underlying channel/medium and/or the properties of the decoding system, as is explained in detail below.

In addition to controlling the frequency of occurrence of certain bit patterns, the code rate of an MD code may also be linked to its Markov distribution. For example, for a memory length N, the theoretical code rate for an MD code defined by Markov probabilities $p_i$ may be given by $$r = \sum_{i=0}^{2^N-1} \sum_{j=0}^{2^N-1} \mu_i P_{ij} \log_2 \frac{1}{P_{ij}}, \quad (1)$$

where the probabilities $\mu_i$ are stationary state probabilities and $P_{ij}$ are transition probabilities uniquely defined based on the Markov distribution. While the above information-theoretic code rate may not be achievable by an actual implementation of an MD code, it may be closely approached by designing codes that closely approximate the underlying Markov distribution. Implementation techniques that may be suitable to design such codes are discussed in detail in relation to FIGS. 9-12.

In practice, it may be important to optimize the distribution of an MD code based on specifics of the underlying channel/medium and/or specific properties of a decoding system. As part of the optimization process, it may useful to keep the memory length N of the MD code fixed while optimizing the Markov probabilities. While the memory length N may be subject to a separate optimization procedure, as will be discussed in relation to FIG. 6, keeping N constant has the benefit of keeping the number of Markov probabilities fixed. Otherwise, if N is allowed to change while the Markov probabilities are being optimized, the number of Markov probabilities will change at the same time as the values of the Markov probabilities themselves. This may be undesirable in practice and motivates determining N and $p_i$ separately. Similarly, as part of the optimization procedure, the code rate R may be kept fixed, or it may be optimized together with the Markov probabilities. Specifically, if the code rate is kept fixed, the only objective of the optimization problem may be to determine Markov probabilities. When the code rate is flexible, the Markov probabilities may be selected "more freely" as the optimization procedure may concurrently change the code rate of the system such as to achieve improved system performance.

An objective of the present disclosure is to describe an optimization procedure that adapts to channel parameters and properties of a given decoding system. Generally, the parameters and properties of the underlying channel and the decoding system are represented by a mathematical model of the physical phenomena that occur in an actual system or product, in order to make these phenomena accessible to mathematical optimization techniques. The mathematical model may include a complex approximation of noise and inter-symbol interference, including possible inter-track interference. The disclosed optimization procedure may be general enough to be applied to any system that can be formulated as described below.

In some embodiments, the mathematical model of the decoding system may be based on quantifying the transfer of extrinsic information. Extrinsic information corresponds to the additional information obtained by channel detector 214 or ECC decoder 222 in an iteration of the decoding process. In each iteration the processing improves the information state about the received vector being decoded, and in this context, the extrinsic information represents additional information about the message that is obtained in addition to the previous information state of a prior iteration. As part of iterative decoding algorithms, extrinsic information is exchanged between channel detector 214 and ECC decoder 222 to ensure that only "new" information gained during an iteration, but not previously-known information, is being exchanged.

In some implementations, other metrics may be used to represent the information state at channel detector 214 and ECC decoder 222. For example, signal-to-noise ratios (SNR), signal-to-interference-plus-noise ratios (SINR), mutual information, or any other suitable type of metric may be used. In some aspects, mutual information may be viewed as a measure of the mutual dependence of two random variables. For example, if two random variables are statistically independent, then knowledge of one of the random variables does not provide any information about the other random variable. The mutual information of these two variables is therefore zero. In contrast, if the two variables can be derived deterministically from one another (e.g., when the first random variable is a deterministic function of the second random variable), then the mutual information is large because all information conveyed by one of the random variables is shared with the other random variable.

Figure 3:
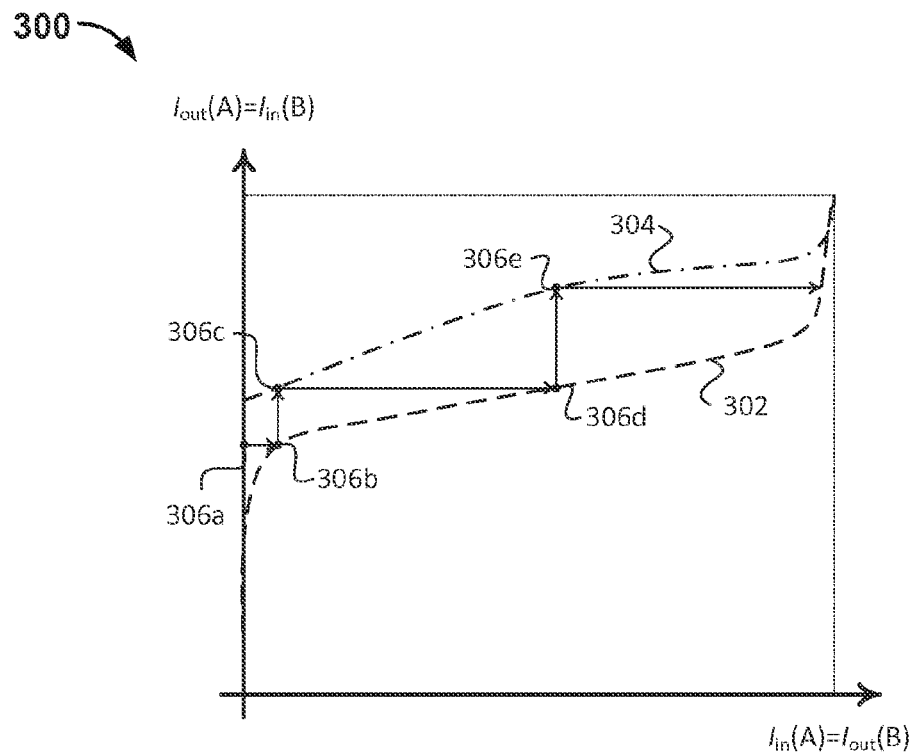
FIG. 3 shows an illustrative extrinsic information transfer (EXIT) chart for a channel detector and an ECC decoder, in accordance with some embodiments of the present disclosure.

FIG. 3 shows an illustrative extrinsic information transfer (EXIT) chart 300 for a channel detector and an ECC decoder, in accordance with some embodiments of the present disclosure. EXIT chart 300 may include ECC decoder transfer function 302 and channel detector transfer function 304. A point on the curve of either transfer function 302 or 304 may represent a certain amount of a posteriori information quantified in terms of a mutual information metric. Using EXIT chart 300, the extrinsic information gained in iterations of iterative decoder 200 may be quantified as follows. The iterative decoding process starts when a received vector has been proceeded by frontend 212 and is being processed by channel detector 214 for the first time. For the first iteration of the channel detector, no a priori information is available, and the processing of the received vector by channel detector 214 yields a certain amount of a posteriori information $I_{out}(A)$, where the letter "A" denotes the processing by Block A (i.e., numeral 210) in FIG. 2. As is discussed in relation to FIG. 2, the output $I_{out}(A)$ of channel detector 214 serves as an input to ECC decoder 222 and is denoted as $I_{in}(B)$. The letter "B" denotes the processing by Block B (i.e., numeral 220 in FIG. 2). In EXIT chart 300, this a posteriori information may be denoted by operating point 306a on the y-axis of EXIT chart 300. Operating point 306a may correspond to operating point 306b on ECC decoder transfer function 302. The corresponding a posteriori information $I_{out}(B)$ of the ECC decoder is given by the x-axis of EXIT chart 300. In accordance with FIG. 2, the a posteriori information output by ECC decoder 222 is equal to the a posteriori information $I_{out}(A)$ that is input to channel detector 214 in the next iteration. Operating point 306b may be used to determine a point at which the a posteriori information output by ECC decoder 222 intersects channel detector transfer function 304. This point may be denoted as operating point 306c. At this point, one full iteration of iterative decoding system 200 may be complete, and from operating point 306c, operating points 306d and 306e may be determined. As shown by path 306, EXIT chart 300 visualizes how iterations of iterative decoding system 200 improve the a posteriori information available about the received vector and contribute to the decoding of it.

In some aspects, EXIT chart 300 may assume that a single parameter may be used to represent the evolution of a posteriori information and their associated probability distributions in channel detector 214 and ECC decoder 222. For example, the parameter may correspond to the variance of a Gaussian distribution for which the variance between the distribution's mean and variance is fixed. In some aspects, even when the assumption that a single parameter captures the probability distribution in its entirety, is not satisfied in a strict mathematical sense, empirical data may show that the assumption is a good approximation, especially when the shape of the probability distributions does not change much from one iteration to the next. Accordingly, even in such systems, EXIT chart 300 may represent an attractive framework for carrying out the optimization of Markov probabilities.

In some embodiments, the MD code may be optimized by adjusting the Markov probabilities such that the shape of channel detector transfer function 304 allows for improved convergence with respect to ECC decoder transfer function 302. As part of the optimization, the shape of ECC decoder transfer function 302 may be fixed, while adjustments to the Markov probabilities alter the shape of channel detector transfer function 304. In some aspects, the optimization of the shape of channel detector transfer function 304 may be performed iteratively. Conceptually, in each iteration, the channel detector transfer function may be re-plotted to capture adjustments made to some of the Markov probabilities. It should be noted, however, that the plotting of channel detector transfer function 304 is not required when the optimization is carried out automatically, e.g., as part of a curve fitting process that is performed in accordance with the techniques described below.

In some embodiments, it may be desirable that channel detector transfer function 304 have two properties. First, it may be desirable to increase the area under the channel detector transfer function, because it reflects an achievable decoding accuracy in absolute terms. Second, channel detector transfer function 304 should match the shape of ECC decoder transfer function 302. The latter optimization objective is important because, depending on the actual properties of iterative decoding system 200, the shapes of channel detector transfer function 304 and ECC decoder transfer function may differ substantially.

The optimization of the shape of channel detector transfer function 304 may be complicated by the fact that there may be no analytical expression for the transfer function. Rather, channel detector transfer function 304 may merely be represented by a (potentially large) number of points that lie on the transfer function. Keeping track of this potentially large number of points may complicate the optimization process by making it more computationally expensive and thereby slower to carry out. In some aspects, the complexity of the optimization procedure may be reduced by representing channel detector transfer function 304 by a small number of critical points. Generally, two or three such critical points may suffice to carry out the optimization procedure. However, it may be important that these two to three critical points be selected judiciously. For example, the critical points may be selected at locations for which the smallest difference between channel detector transfer function 304 and ECC decoder transfer function 302 is expected. Selecting a critical point at such a location may further ensure that channel detector transfer function 304 and ECC decoder transfer function 304 do not cross, because if at all, the transfer functions would be expected to cross at this location. Alternatively or additionally, critical points may be selected in a way that allows control of the slope of channel detector transfer function 304. At least two critical points may be needed to define the slope. Further, critical points may be selected such that a shape of channel detector transfer function 304 is fixed. For example, three or more critical points may be used to ensure that channel detector transfer function 304 have a concave (e.g., "downward bending") shape.

Figure 4:
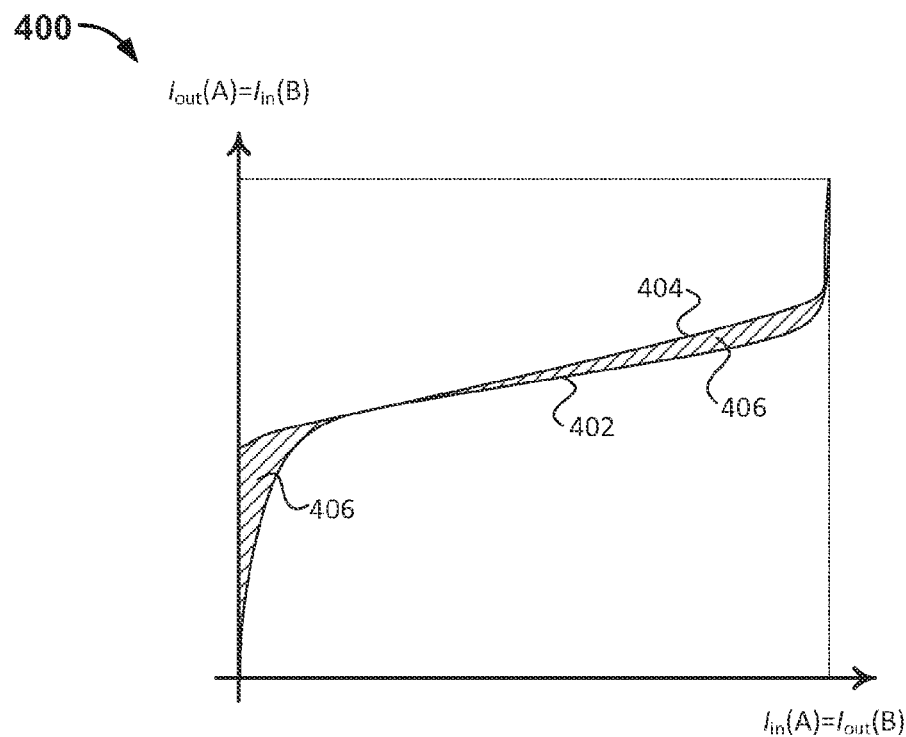
FIG. 4 shows an illustrative EXIT chart of a channel detector that has been fitted to the transfer function of an ECC decoder, in accordance with some embodiments of the present disclosure.

In addition or as an alternative to specifying critical points, other optimization criteria may be employed to optimize the shape of channel detector transfer function 304. For example, the shape of channel detector transfer function 304 may be determined such that a difference in area under the curves is minimized. FIG. 4 shows an illustrative EXIT chart 400 of a channel detector that has been fitted to the transfer function of an ECC decoder, in accordance with some embodiments of the present disclosure. Similar to EXIT chart 300 discussed in relation to FIG. 3, EXIT chart 400 may include a channel detector transfer function 404 and an ECC decoder transfer function 402. EXIT chart 400 further depicts area 406, which lies beneath channel detector transfer function 404 but above ECC decoder transfer function 402. The size of area 406 may be selected as an optimization metric, and the shape of channel detector transfer function 404 may be optimized such that the size of area 406 is minimized. On an intuitive level, it is clear that minimizing the size of area 406 must lead to alignment of the shapes of channel detector transfer function 404 and ECC decoder transfer function 402. Alternatively, the optimization procedure may also account for the speed of iterative decoder convergence, for example, by considering a fixed number of decoding iterations in iterative decoding system 200.

Figure 5:
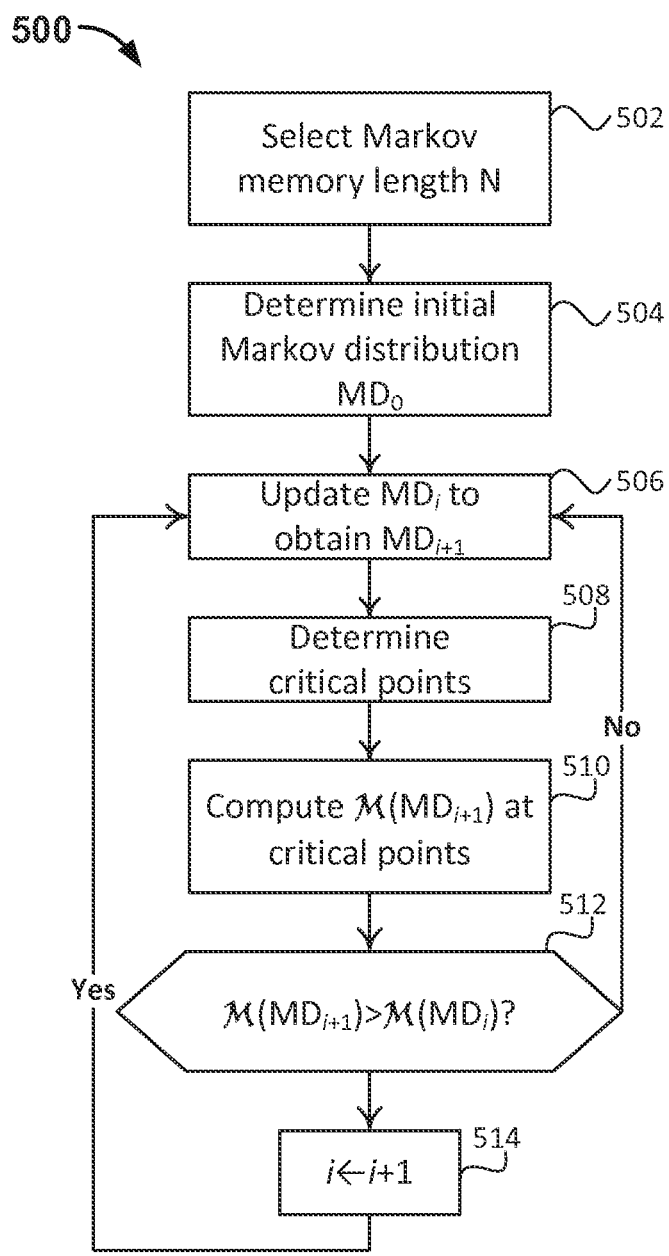
FIG. 5 shows a process for determining a Markov distribution based on properties of a decoding system, in accordance with some embodiments of the present disclosure.

FIG. 5 shows a process 500 for determining a Markov distribution based on properties of a decoding system, in accordance with some embodiments of the present disclosure. Process 500 may start at 502 by selecting a Markov memory length N. As discussed in relation to FIG. 2, the Markov memory length may specify the length of bit sequences for which Markov probabilities are defined. Implicitly, the Markov memory length N also specifies the number of probabilities values that are necessary to fully define the Markov distribution. For example, for N=4, there exist 16 different bit sequences and therefore 16 Markov probabilities are required to fully define the Markov distribution. Similarly, for N=6, there exist 64 different bit sequences and therefore 64 Markov probabilities are required to fully define the Markov distribution. It should be understood that the parameter N not only impacts the complexity of the MD code by increasing the number of Markov probabilities. As N increases, so does the complexity of actual encoder and decoder structures that approximate the Markov distribution. Exemplary encoder and decoder implementations that approximate a given Markov distribution (e.g., the Markov distribution that is found as a result of the optimization procedure), will be discussed in relation to FIGS. 8-12 below. A process for selecting the Markov memory length N will be discussed in relation to FIG. 6.

Process 500, at 504, may determine an initial Markov distribution $MD_0$, which is used as a starting point of the optimization procedure. In some aspects, it is important to appreciate that the selection of $MD_0$ implicitly defines a code rate associated with the MD code. In general, at lower code rates, it may be easier to find MD codes that induce transfer functions with smaller (e.g., less steep) slope. Such transfer functions, because they are less steep, have higher output information rates at low input information rates. This may be taken into account in matching the shape of ECC decoder transfer function 302, e.g., if transfer function 302 also has such a property. Conversely, at higher MD code rates, it may be easier to find MD codes that induce channel detector transfer functions 302 with a large (e.g., steeper) slope. Such transfer functions, because they are steeper, may be associated with lower output information rates at the low input information rates and high output information rates at higher input information rates. In some aspects, the steepness of the curve may therefore be a design factor that enables a judicious selection of $MD_0$ based upon the slope of the ECC decoder transfer function 302 for which channel detector transfer function 304 is being optimized.

In some implementations, selecting $MD_0$ based on properties of the ECC decoder transfer function 302 may speed up the optimization procedure. For example, in data storage applications, user-bit density (UBD) may be a design consideration. Generally, as UBD increases, the slope of the channel decoder transfer function, for a fixed MD code, naturally becomes steeper. This trend may be balanced by selecting a lower MD code rate as the value of UBD increases.

At 506, process 500 may update initial Markov distribution $MD_0$, or the Markov distribution of a previous iteration $MD_i$, to obtain an updated distribution $MD_{i+1}$. Updates to the Markov distribution may be performed in various ways, such as by increasing or decreasing one or more of the Markov probabilities. In some aspects, it may not be necessary to restrict the code rate that results from the updated Markov distribution. In fact, placing no restrictions on the code rate of the Markov distribution may allow the optimization procedure to optimize both the Markov probabilities and the code rate at the same time, and assuming that there are no physical restrictions on the code rate, the iterative optimization procedure should naturally converge to an optimal or close-to-optimal code rate. In other embodiments, similar to finding an initial Markov distribution at 504, updates to the Markov distribution may take the Markov distribution's code rate into account. For example, in some applications a restriction may be placed on the minimum code rate such as to limit the amount of redundancy to a certain amount R. This amount R may be shared between the ECC code and the MD code, but since the ECC code (and thus the ECC code's rate and redundancy) may be assumed fixed as part of the optimization procedure, the maximum MD code redundancy (i.e., the minimum MD code rate) may be known. It should be understood that, if desirable, this constraint may easily be incorporated into the optimization procedure by restricting the set of admissible code rates for the Markov distribution that is being optimized. Code rates that fall outside of the admissible set of code rates may be disallowed during the update step and may therefore be prevented from occurring as the result of the optimization procedure. In some implementations, the code rate of the ECC code may not be assumed fixed, such as when no satisfactory ECC code is known. In such a case, both the MD code and the ECC code may be optimized jointly.

Process 500 may update the Markov probabilities by modifying some, typically few, of the Markov probabilities. The remaining Markov probabilities may need to be renormalized as a result of the modification. In one implementation, a single one of the Markov probabilities may be updated. For example, one of the Markov probabilities may be selected in a random, semi-random, or deterministic fashion. The selected Markov probability, say $P_J$ may then be updated such that $P_J^{(new)} = P_J^{(old)} + \Delta J$, where $\Delta J$ is selected from a suitable range such as $\Delta J \in [-x, x]$. As a result of the modification of $P_J$, the remaining Markov probabilities are then renormalized to maintain a valid Markov distribution.

In some aspects, the direction of the change (e.g., whether $\Delta J$ is positive or negative) may be selected randomly. The direction may also be selected semi-randomly or semi-deterministically. For example, the determination may be based on the code rate. If it known that the code rate should be increased, the probabilities may be modified in a direction that leads to larger code rate (e.g., by selecting them to be close to 0.5). Conversely, if the code rate should be decreased, the Markov probabilities may be changed such that they are closer to 0 or 1, which in turn decreases the code rate.

In some embodiments, it may be desirable to enforce certain predefined constraints as part of the optimization procedure. For example, it may be desirable to subject the Markov probabilities to hard constraints, such as $P_J=0$ or $P_J=1$ for a certain index J. This may be beneficial if it must be ensured that certain transitions are entirely prevented from occurring. It should be noted that, when such a hard constraint is beneficial for a certain decoding system, the optimization procedure should automatically satisfy the constraint. However, if it is known a priori that a certain constraint should be met, the optimization procedure may converge more quickly by enforcing the constraint explicitly.

In some embodiments, the modifications of the Markov probabilities may need to be performed subject to strict code rate constraints. For example, the MD code's code rate may need to be fixed at a predetermined value throughout the optimization procedure. In such a case, updates to the Markov probabilities may be performed such that the code rate remains fixed at all times. For example, this may be ensured by first modifying one of the Markov probabilities as discussed above and then modifying the remaining Markov probabilities such that the code rate remains the same (e.g., using EQ. (1)).

At 508, process 500 may determine critical points in the EXIT charts of channel detector 214 and ECC decoder 222. For example, critical points may be determined in relation to channel detector transfer function 304 and ECC decoder transfer function 302, as discussed in relation to FIG. 3. In some implementations, the determined critical points may remain fixed throughout process 500. In other implementations, the critical points may be determined anew in each iteration. For example, if the critical points are selected in order to correspond to extreme points (e.g., maxima or minima) of the channel detector transfer function, the critical points may need to be determined in each iteration, because the shape of the transfer function may change in each iteration as the Markov distribution is updated.

It should be understood that channel detector transfer function 304 must lie above (e.g., must "clear") ECC decoder transfer function 302. Otherwise, if the transfer functions crossed, an iterative decoding procedure would fail to converge. In accordance with this observation, it may be desirable to determine the critical points of the transfer functions to lie in the region where such a cross-over is anticipated to occur.

In doing so, the distance of the channel detector and ECC decoder transfer functions may be explicitly evaluated as part of the optimization procedure and undesired cross-overs can be avoided.

Generally, the distance between the channel detector and ECC decoder transfer functions determines the speed of the optimization procedure. If the distance between the transfer functions is large, few iterations typically lead to convergence, as is shown in relation to FIG. 3. On the other hand, if the distance between the transfer functions is small, a larger number of iterations may be required, because each iterations improves the a posteriori information by only a small amount.

Process 500, at 510, may compare the updated Markov distribution $MD_{i+1}$ with the Markov distribution of the previous iteration, $MD_i$. The comparison between the distributions may be based on a performance metric $\mathcal{M}(\bullet)$. This performance metric may be defined in a number of ways. In one example, the performance metric may be based on the values of the channel detector transfer function 304 evaluated at the determined critical points. In other implementations, the transfer functions of the channel detector and ECC decoder may be compared by other suitable metrics. In the following, examples will be provided on how the transfer functions may be compared based on one, two, or three critical points.

When the transfers functions of channel detector and ECC decoder are compared based on a single critical point, the Markov distribution with higher information rate at the crucial point may be selected.

When the transfer functions of channel detector and ECC decoder are compared based on two critical points, the Markov distribution that better fits the shape of ECC decoder transfer function 302 may be selected. In particular, process 500 may first verify that, at both points, the information rate of the channel detector transfer functions is greater than the respective value of the ECC decoder transfer function. If this condition is not satisfied, the new Markov distribution may be eliminated as it would prevent iterative decoding system 200 from converging. If the condition is satisfied, the updated Markov distribution may be selected if the area between the channel detector transfer function and the ECC decoder transfer function (e.g., as illustrated in FIG. 4) is larger for the updated Markov distribution than for the previous Markov distribution.

When the transfer function of channel detector and ECC decoder are compared based on three critical points, process 500 may also determine whether the updated Markov distribution achieves a better fit with ECC decoder transfer function 302. First, process 500 may determine whether the information rates of the updated Markov distribution, evaluated at the critical points, exceed the information rates of ECC decoder transfer function at these critical points. If this condition is not satisfied, the updated Markov distribution may fail to satisfy the convergence properties required for iterative decoding system 200. If the condition is satisfied, process 500 may again compare the area difference between the transfer functions between the updated and previous Markov distributions. The updated Markov distribution may be selected if the area between the curves increases. For the case of three critical points, it may be assumed that the channel detector transfer function 302 is piecewise linear, in order to avoid having to evaluate the transfer function at more than the three critical points.

At 512, process 500 may determine whether the updated Markov distribution is associated with a larger performance metric than the previous Markov distribution.

If the updated Markov distribution is associated with a smaller performance metric, then the updated Markov distribution may be discarded and the previous Markov distribution may be retained. Process 500 may then resume at 506 by performing a different update to the Markov distribution. Conversely, if the updated Markov distribution is associated with a larger performance metric, then process 500 may discard the previous Markov distribution and retain the updated Markov distribution as the optimal distribution obtained so far. Process 500 may then resume at 506 by updating the Markov distribution in the next iteration.

Process 500 may be repeated for a number of iterations until a stopping criterion is satisfied (e.g., until some performance metric reaches a threshold), or process 500 may be carried out for a predefined number of iterations. Upon termination of the optimization procedure, the resulting Markov distribution may be used in encoder/decoder implementations as will be described in relation to FIG. 8-12. In some implementations, process 500 may be carried out multiple times using different initial Markov distributions. Multiple Markov distributions may be obtained as a result of these optimizations, and among these the best may be selected for implementation.

Figure 6:
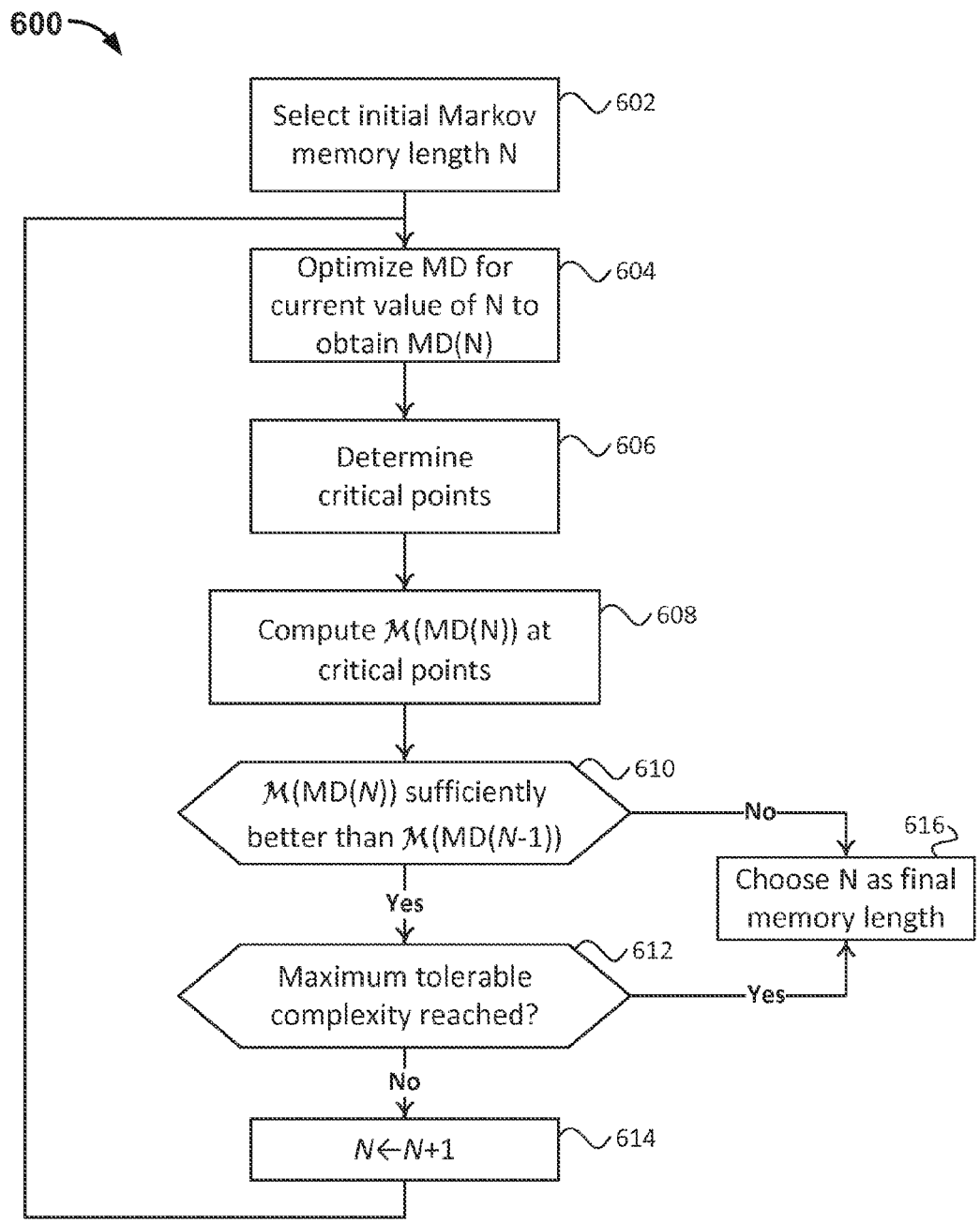
FIG. 6 shows a process for determining an appropriate memory length of a Markov distribution, in accordance with some embodiments of the present disclosure.

FIG. 6 shows a process 600 for determining an appropriate memory length of a Markov distribution, in accordance with some embodiments of the present disclosure. Process 600 may, at 602, select an initial Markov memory length, such as N=2. Next, process 600 may carry out process 500 in order to find an optimal Markov distributions for the current Markov memory length N. The resulting optimal Markov distribution, denoted $MD_{(N)}$, may then be used to compute a code rate as well as information rates at a number of critical points of the channel detector transfer function associated with $MD_{(N)}$. The transfer function of $MD_{(N)}$ may then be compared with the transfer function of a Markov distribution with a memory length of N−1, e.g., $MD_{(N-1)}$. If the transfer function for this Markov distribution is not available from a previous iteration, process 500 may be carried out for the Markov distribution with memory length N−1 in order to obtain a reference for comparison. For N=1, the comparison between $MD_{(1)}$ and $MD_{(0)}$ may correspond to comparing $MD_{(1)}$ to the performance without an MD code, because $MD_{(0)}$ may be equivalent to an MD code with rate r=1.

At 610, process 600 may determine whether the performance of $MD_{(N)}$ is sufficiently better than the performance of $MD_{(N-1)}$. Process 600 may determine whether there is a sufficient performance improvement by trading off the performance gain with the increase of complexity that results from an increased memory length. For example, if for a given code, the performance gain between N=2 and N=3 is large, but the performance gain between N=3 and N=4 is small, selecting N=3 may correspond to a good tradeoff between performance and complexity. At 612, process 600 may determine whether a maximum tolerable complexity has been reached. The maximum tolerable complexity increases with the memory length N and depending on architecture constraints in terms of size, complexity, power consumption, or other factors, an implementation may only be able to support Markov memory lengths up to a certain point. If process 600 determines at 612 that the maximum memory length has been reached, process 600 may terminate at 616; otherwise, process 600 may increase N by one and continue at 604.

Figure 7:
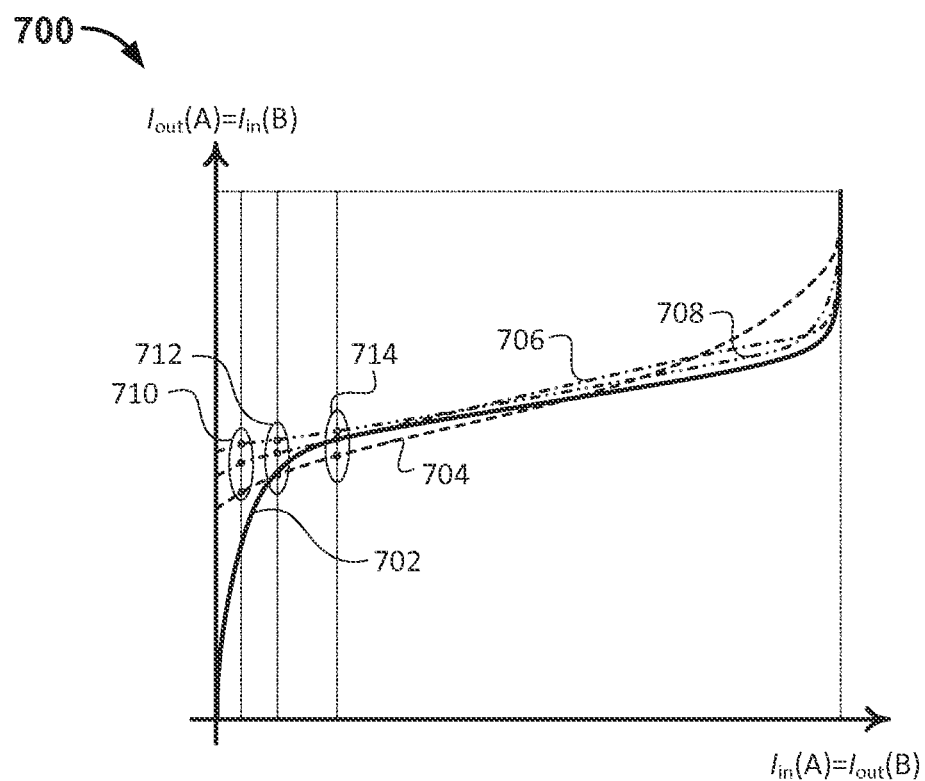
FIG. 7 shows an illustrative EXIT chart associated with respective iterations of a Markov distribution code, in accordance with some embodiments of the present disclosure.

FIG. 7 shows an illustrative EXIT chart 700 associated with respective iterations of a Markov distribution code, in accordance with some embodiments of the present disclosure. Similar to EXIT charts 300 and 400, EXIT chart 700 includes an ECC decoder transfer function 702. EXIT chart 700 also includes three channel detector transfer functions 704, 706, and 708. Each of transfer functions 704, 706, and 708 corresponds to an iteration of process 500. For example, channel detector transfer function 704 may correspond to the channel detector transfer function associated with a Markov distribution in the first iteration of process 500. Channel detector transfer function 704 may be associated with undesirable properties, such as a cross-over with ECC decoder transfer function 702. As part of process 500, channel detector transfer function 704 may be improved to yield channel detector transfer functions 706 and 708. As discussed in relation to FIG. 5, process 500 may rely on critical points to speed up convergence. EXIT chart 700 illustrates a selection of such critical points at 710, 712, and 714. FIG. 7 further illustrates that critical points 710, 712, and 714 improve as part of the optimization procedure, because the values of channel detector transfer functions 704-708 improve throughout process 500 at each of critical points 710-714.

In some embodiments, should process 500 not lead to a satisfactory Markov distribution, a joint optimization of ECC decoder transfer function 302 and channel detector transfer function 304 may be performed. The joint optimization may start by preselecting a good ECC code for the decoding system (e.g., channel) of interest. Once the ECC code has been selected, process 500 may be used to obtain an MD code and corresponding channel detector transfer function 304. Next, the ECC code may be optimized while the MD code remains fixed, using a similar technique as in process 500. Finally, the last steps are repeated several times until convergence of the ECC code and MD code is reached.

Once a final Markov distribution has been obtained as a result of the optimization procedure, encoder and decoder implementations may be designed based on the target Markov distribution. The encoder implementation may encode user information 102 such that codeword 106 has a Markov distribution that is close to the target Markov distribution obtained from the optimization procedure. In some embodiments, the encoder implementation may be based on a set of parameters that defines how the user information is transformed into encoded data. For example, an MD encoder may be constructed by enforcing that a weighted number of ones does not exceed a certain threshold within a block of encoded data.

Figure 8:
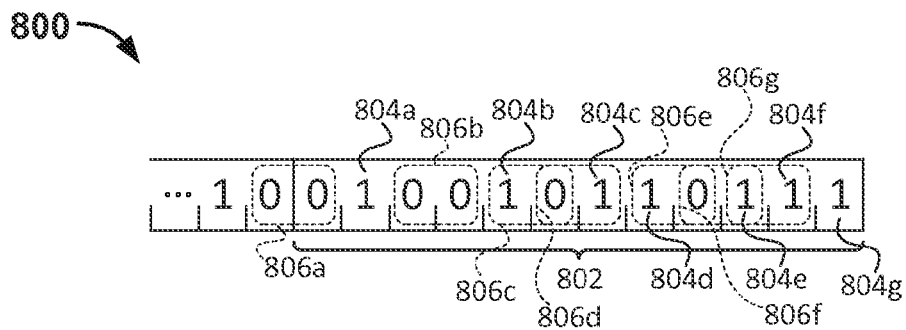
FIG. 8 shows a bit sequence to illustrate the definition of a weighted number of ones, in accordance with some embodiments of the present disclosure.

FIG. 8 shows a bit sequence 800 to illustrate the definition of a weighted number of ones, in accordance with some embodiments of the present disclosure. Bit sequence 800 may include a block of a Markov distribution code, such as block 802 which consist of L=12 binary entries. For block 802, the weighted number of ones may be defined as $$\sum_{k=0}^{L-1} a_k w(a_{k-N} \ldots a_{k-1}).$$

For bit sequence 800, this weighted number of ones may be determined as follows. Assuming a Markov memory length of N=2, there exist a total of four different weights, viz. w(00), w(01), w(10), and w(11). The weighted number of ones may be determined by counting the occurrence of "00", "01", "10", and "11" patterns that precede a given "1" in the bit sequence and multiplying the number of occurrences with the respective weights. For example, for bit sequence 800, the locations of ones in the sequence occur at locations 804a-804g. The two-bit patterns that precede locations 804a-804g are denoted as patterns 806a-806g in bit sequence 800. Specifically, the "00" bit pattern precedes a logical one twice (at locations 804a and 804b), the "01" bit pattern precedes a logical one once (at location 804f), the "10" pattern precedes a logical one twice (at locations 804c and 804e) and the "11" pattern precedes a logical one once (at location 804g). Assuming exemplary weights of i<00)=1, w(01)=2, w(10)=2, and w(11)=3, the weighted number of ones is given by multiplying these occurrences with their respective weights, i.e., $$2 \times w(00) + 2 \times w(10) + w(01) + w(11) = 11.$$

The weighted number of ones may be used to construct a trellis that can be used to approximate the MD code by using enumerative coding techniques. However, in order to do so, it is necessary to define the weights w, the threshold P, and the block length L such that the values of these parameters correspond to the target Markov distribution.

Figure 9:
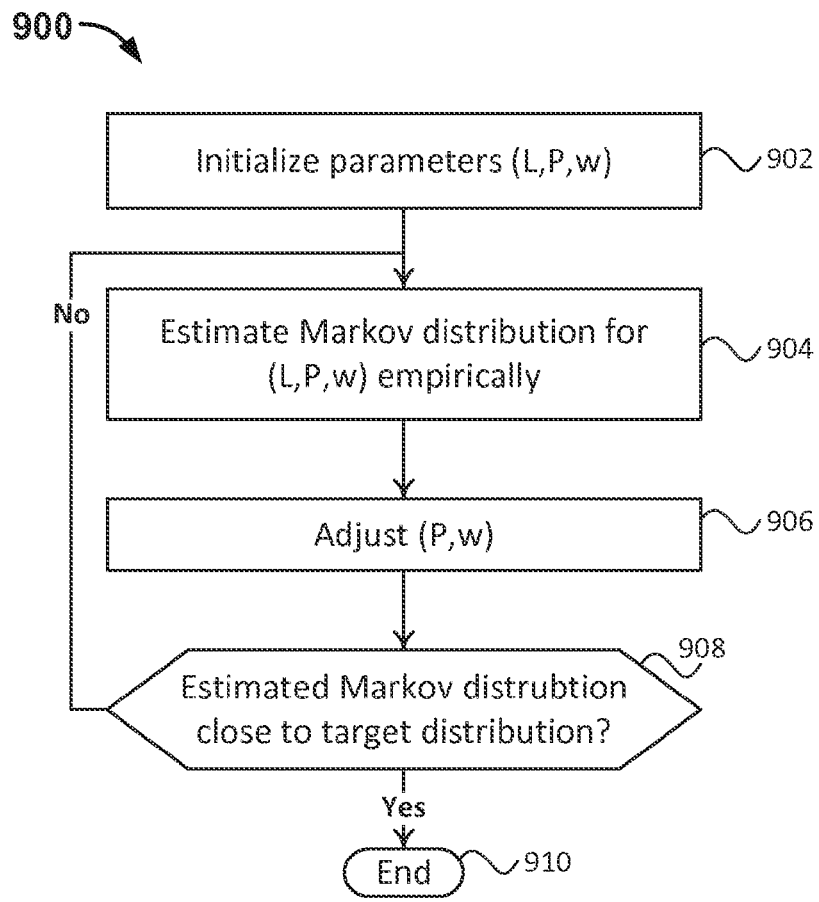
FIG. 9 illustrates a process for choosing encoding parameters based on a target Markov distribution, in accordance with some embodiments of the present disclosure.

FIG. 9 illustrates a process 900 for choosing encoding parameters based on a target Markov distribution, in accordance with some embodiments of the present disclosure. Process 900 may start at 902 by initializing the encoding parameters L, P, and the weights w. In some embodiments, the parameter L may be selected first. Generally, choosing a large L results in a better approximation of the Markov distribution; however, a large L also makes it more complex to implement the encoder and the decoder. As a result, a practical implementation may need to strike a tradeoff between representing the Markov distribution with sufficient accuracy and limiting implementation complexity.

At 904, process 900 may estimate the Markov distribution that corresponds to a specific set of parameters L, P, and w. The Markov distribution may be estimated by randomly generating a block of binary data of length L with zeros and ones occurring with equal probability. For each of the blocks, the weighted number of ones may be determined, as discussed in relation to FIG. 8. If the weighted number of ones for a block exceeds the threshold P, the block is discarded; otherwise, it is retained. Upon generating a sufficiently large number of such blocks, the retained blocks may used to determine the Markov distribution by counting the number of transitions and thus estimating the transition probabilities. As long as a sufficient number of blocks have been used, the estimate of the Markov distribution should be accurate.

At 906, process 900 may compare the estimated Markov distribution with the target Markov distribution and adjust the parameters P and w to better approximate the target distribution. The parameters P and w may be adjusted systematically or in an ad-hoc fashion. In some implementations, increasing the parameter P may increase all Markov probabilities, because the higher threshold allows blocks with a larger weighted number of ones to be included. Similarly, increasing the weight of a specific Markov state (e.g., bit pattern "00") may decrease the corresponding Markov probability because the increased weight leads to a larger weighted number of ones of the data block and thereby tends to exclude the data block.

At 908, process 900 may determine whether the estimated Markov distribution approximates the target Markov distribution sufficiently well. If so, process 900 stops at 910; otherwise, it continues with another iteration of estimating the Markov probability and adjusting the parameter P and w. In some embodiments, in addition to adjusting P and w, the initial value of L may need to be increased in order to achieve a sufficiently accurate approximation of the target distribution. For example, the value of parameter L may be increased in response to determining that, despite having performed a larger number of iterations at 904 and 906, the estimated Markov distribution is still not sufficiently accurate.

In some embodiments, at least one of the Markov probabilities of the target Markov distribution may be subject to a hard constraint, such as $p_j=0$ or $p_j=1$. In such a case, process 900 may take the at least one hard constraint into account at 904 when process 900 randomly generates data. Specifically, instead of generating binary data with equal probabilities of logical zeros and logical ones, the binary data may be generated using an encoder that account for the hard constraint. This encoder may be designed based on principles of constrained encoding, max-entropic encoding, or any other suitable coding technique. Further, since hard constraints are accounted for explicitly as part of generating binary data blocks, their corresponding Markov probability may be set to zero, and may not need to be used in process 900.

Based on the parameters P, w, and L, an encoding trellis may be constructed. The encoding trellis may facilitate generation of data that is associated with the target Markov distribution, for example through enumerative encoding techniques.

Figure 10:
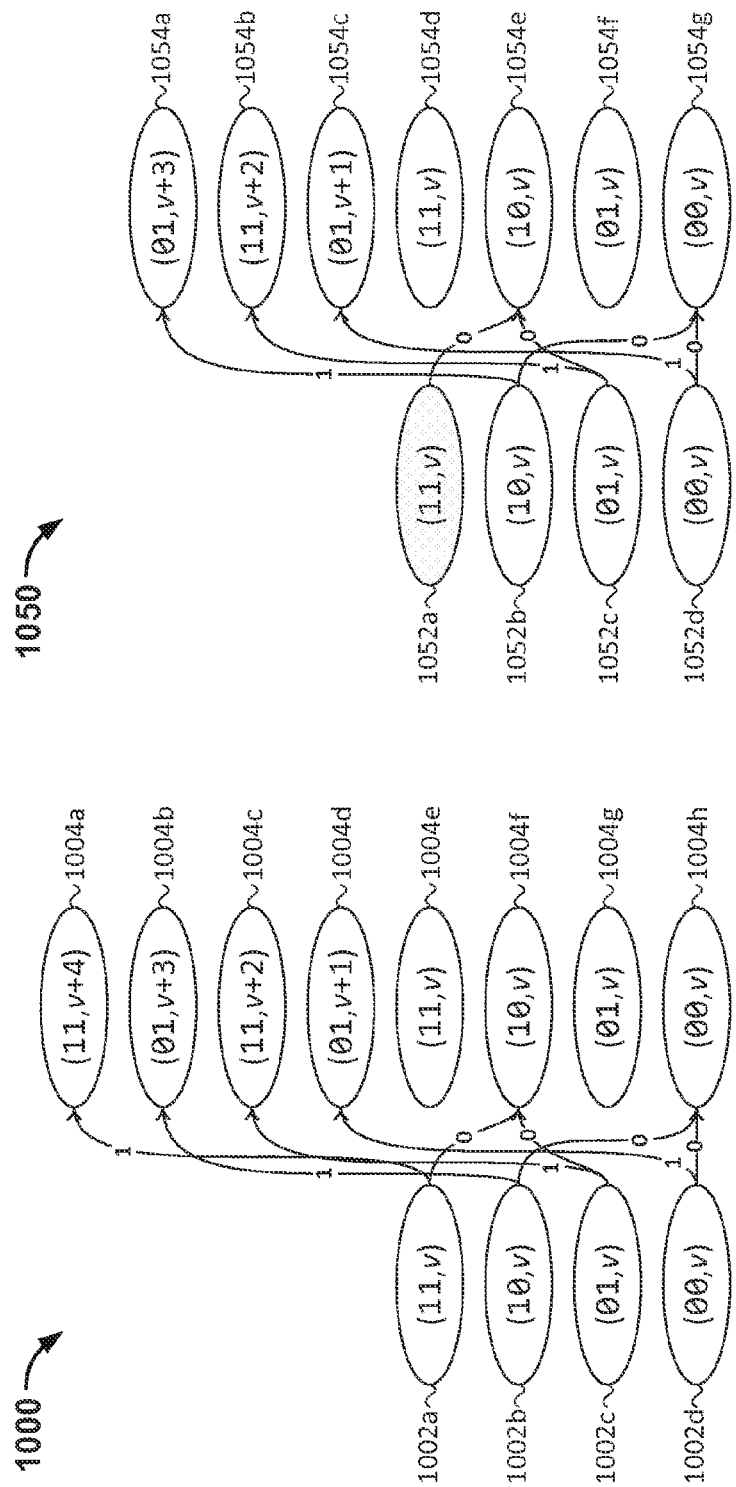
FIG. 10 shows transition diagrams for a Markov distribution code, in accordance with some embodiments of the present disclosure.

FIG. 10 shows transition diagrams 1000 and 1050 for a Markov distribution code, in accordance with some embodiments of the present disclosure. Transition diagram 1000 includes originating states 1002a-1002d and target states 1004a-1004h. Each state includes an indication of the previous two entries in the binary sequence as well as an integer that corresponds to a current weighted number of ones. Transition diagram 1000 illustrates how these metrics are updated from one entry in the binary sequence to the next. Transition diagram 1000 assumes, for illustration, that w(00)=1, w(01)=2, w(10)=3, and w(11)=4.

For each of originating states 1002a-1002d, the next bit in the binary sequence may either be a logical zero or a logical one, i.e., for each of the originating states, there are two possible transitions, one corresponding to the next entry being a logical one, and the other corresponding to the next entry being a logical zero. For each state, the indication of the previous two binary entries may be updated by dropping the oldest entry and adding the entry of the binary sequence of the current transition. For example, for state 1002d (corresponding to "00" and a value of v) and "1" as the next entry in the sequence, the target state 1004d corresponds to "01" and a value of v+1 (due to w(00)=1). Similarly, for state 1002b (corresponding to ("10" and a value of v) and "1" as the next entry in the binary sequence, the target state 1004b corresponds to "01" and a value of v+3 (due to w(10)=3). It is important to realize that, in accordance with the definition of the weighted number of ones, the value v may only be updated if the next entry in the binary sequence is a logical one. Otherwise, the value v of a target state may be identical to the value v of the originating state; in that case only the indication of the previous two entries of the binary sequence may be updated.

Transition diagram 1050 illustrates a modification to transition diagram 1000 to account for a hard constraint in the target Markov distribution. Transition diagram 1050, similar to transition diagram 1000, includes originating states 1052a-1052d as well as target states 1054a-1054g. However, different from transition diagram 1000, originating state 1052a is associated with a hard constraint, e.g., because whenever "11" appears in the binary sequence, the following entry must necessarily be a logical zero. As a result of this hard constraint, originating state 1052a does not include a transition corresponding to the next entry in the binary sequence being "1." In contrast, starting from originating state 1052a, the target state must necessarily be target state 1054e. As illustrated by transition diagram 1050, such a hard constraint may be accounted for by removing disallowed transition (e.g., transitions that would occur with zero probability).

Figure 11:
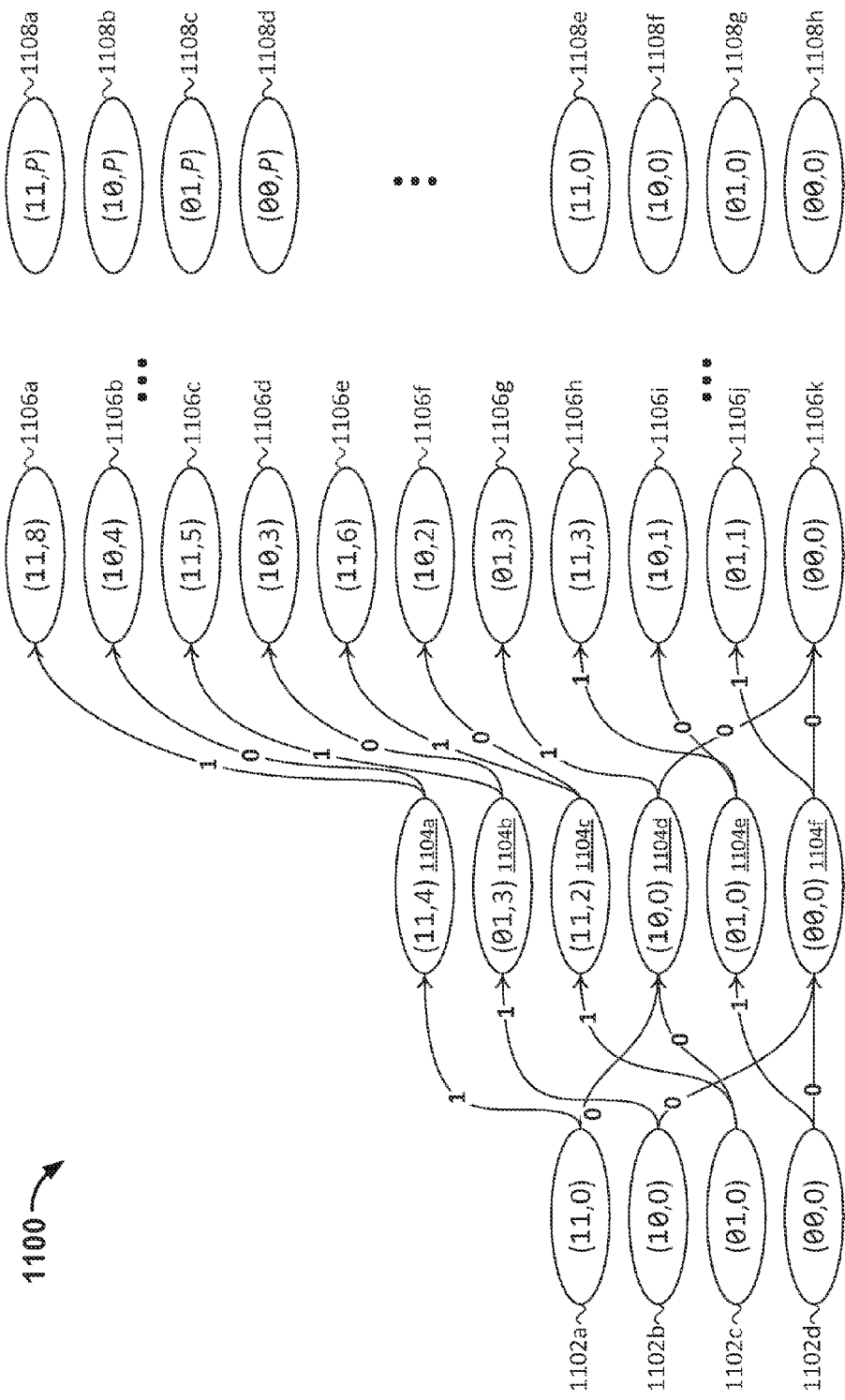
FIG. 11 shows a trellis for a Markov distribution code, in accordance with some embodiments of the present disclosure.

FIG. 11 shows a trellis 1100 for a Markov distribution code, in accordance with some embodiments of the present disclosure. Trellis 1100 includes L stages of states, wherein each stage reflects a position in the binary sequence of length L. In some aspects, trellis 1100 may be obtained by concatenating transition diagrams 1000 or 1050 and by accounting for all possible state transitions. Trellis 1100 illustrates how to perform this concatenation. Similar to transition diagrams 1000 and 1050, trellis 1100 assumes that w(00)=1, w(01)=2, w(10)=3, and w(11)=4.

A first stage of trellis 1100 may include states 1102a-1102d. Similar to states 1002 and 1052, each state may be associated with an indication of the previous two entries in the binary sequence and a current value v reflecting the weighted number of ones up to the current state. Because states 1102-1102d all correspond to the first stage in trellis 1100, they are all associated with a value v=0. For states 1102, the indication of the previous two entries in the binary sequence correspond to entries that occur just before the current block, as is illustrated in relation to FIG. 8. Depending on the first entry in the binary sequence within the current block, transitions may occur from states 1102 to states 1104a-f (generally states 1104). The values v are updated in the same fashion as in transition diagrams 1000 and 1050. The number of states needed to account for all possible sequences may depend on the specific values of weights w and the presence of absence of any hard constraint. For example, for trellis 1100, six states (e.g., states 1104) are sufficient to capture all outcomes at the second stage.

Trellis 1100 includes a third stage including states 1106a-1106k (generally states 1106). States 1106 are obtained by applying the rules discussed in relation to transition diagrams 1000 and 1050 to states 1104. For the specific example illustrated by trellis 1100, a total of 11 states may be needed to capture all possible binary sequences that may occur. Trellis 1100 may include a total of L stages, and generally the number of states required to account for all possible sequences grows with each stage. For example, the last stage L−1 may include states 1108a-1108h (generally states 1108). It is important to note that as part of trellis 1100 only states with a value of at most P are required. Any transition that would lead to a target state with a value v that exceeds the threshold P need not be included, because such a sequence does not satisfy the constraints of process 900. Trellis 1100 shows an exemplary case in which threshold P is reached by states 1108a-1108d.

In some embodiments, trellis 1100 may be simplified by merging states that share a common weight and either have the same hard constraint or no hard constraint at all. An exemplary method for simplifying the trellis is discussed in FIG. 12.

Figure 12:
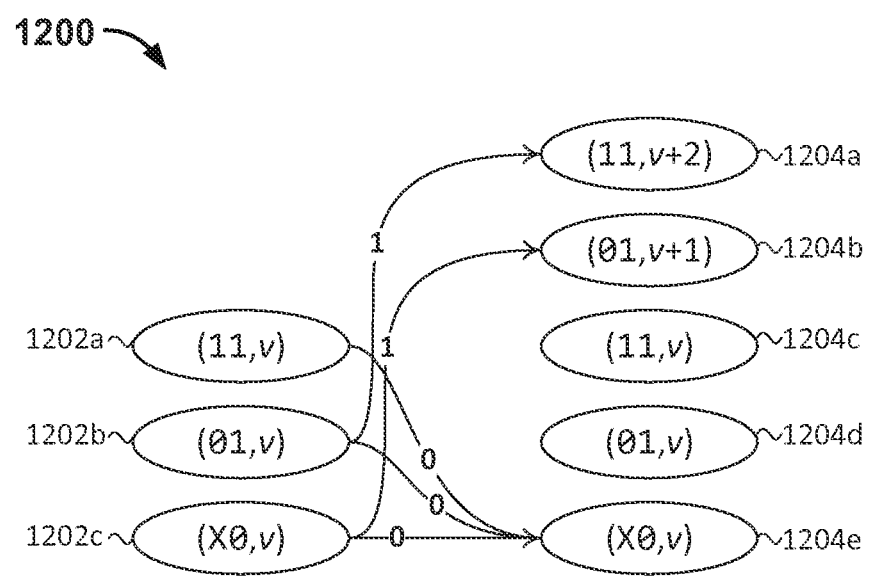
FIG. 12 shows a simplified transition diagram obtained by merging states with similar properties, in accordance with some embodiments of the present disclosure.

FIG. 12 shows a simplified transition diagram 1200 obtained by merging states with similar properties, in accordance with some embodiments of the present disclosure.

Transition diagram 1200 includes two stages. The first stage may include states 1202a-1202c and the second stage may include states 1204a-e. Different from transition diagrams 1000 and 1050, transition diagram 1200 may be based on weights w(00)=1, w(01)=2, w(10)=1, and w(11)=4. Since w(00)=w(10), states 1202c and 1204e need not account for the two previous entries in the binary sequence but rather just the last entry in the binary sequence. This is denoted by an "X" in states 1202c and 1204e. As a result of merging the separate states "00" and "10" into a single state "X0," it is possible to reduce the state space of transition diagram 1200. A trellis based on transition diagram 1200 could thus be stored more cost effectively.

In some embodiments, after obtaining values for w, P, and L from the target Markov distribution, a trellis may be constructed by accounting for all possible transitions that could occur in the binary sequence of length L. After a trellis (e.g., trellis 1100) is constructed, an encoder may be designed based on enumerative coding techniques. In some aspects, such enumerative encoding is based on a look-up table whose size depends on the size of the trellis. The simplifications provided by merging states as shown in trellis 1200 therefore lead to a compressed size of the look-up table and may make an implementation of the enumerative encoder more manageable.

In some aspects, systems and methods for implementing the enumerative encoder are discussed in U.S. patent application Ser. No. 12/110,921 (now U.S. Pat. No. 7,667,626), filed on Apr. 28, 2008 and entitled "ENUMERATIVE DC-RLL CONSTRAINED CODING", which is hereby incorporated by reference herein in its entirety.

Figure 13:
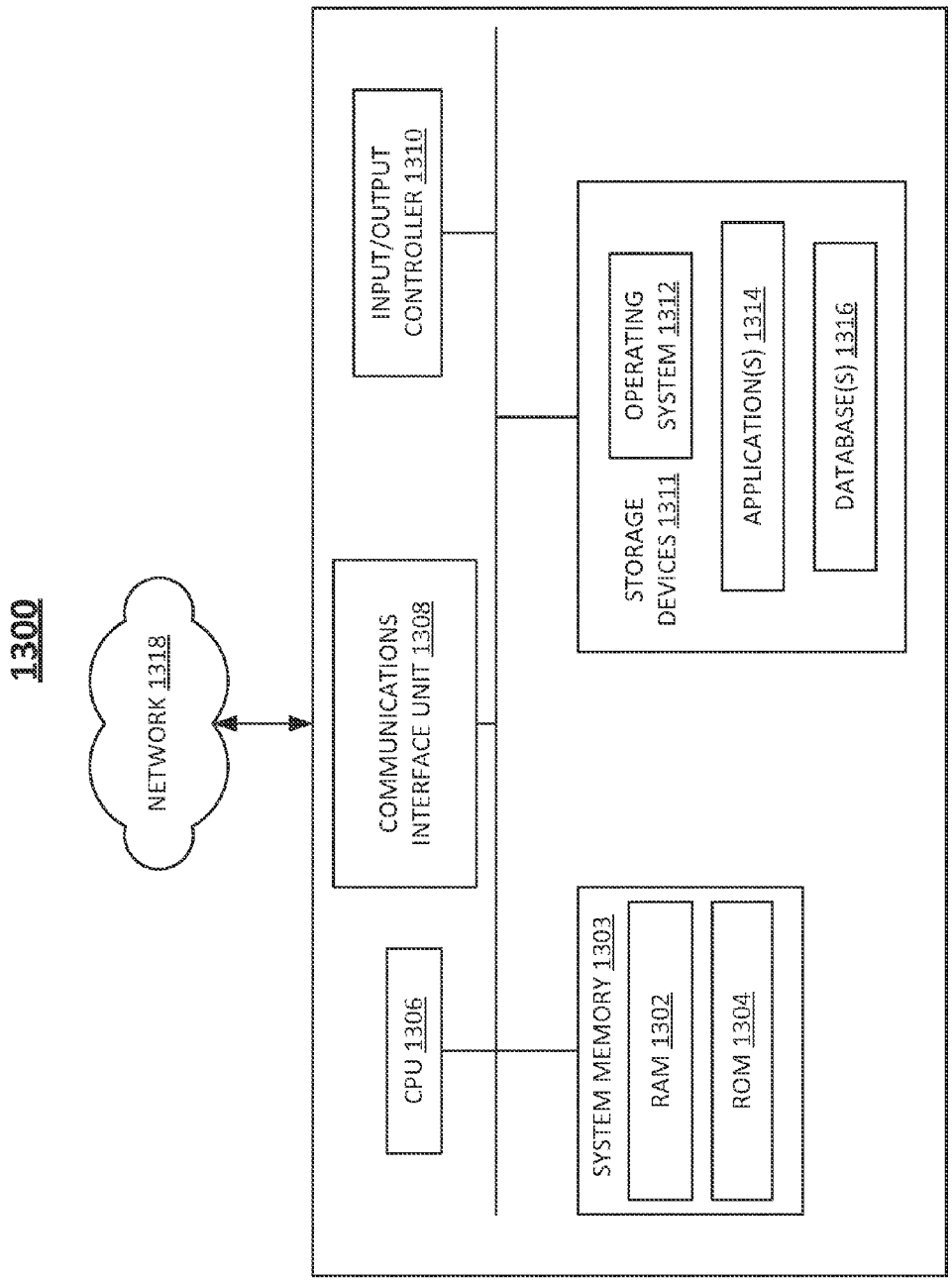
FIG. 13 shows a block diagram of a computing device, for performing any of the processes described herein, in accordance with some embodiment of the present disclosure.

FIG. 13 is a block diagram 1300 of a computing device, such as any of the components of the system of FIG. 1, for performing any of the processes described herein, in accordance with an embodiment of the disclosure. Each of the components of these systems may be implemented on one or more computing devices 1300. In certain aspects, a plurality of the components of these systems may be included within one computing device 1300. In certain embodiments, a component and a storage device 1311 may be implemented across several computing devices 1300.

The computing device 1300 comprises at least one communications interface unit 1308, an input/output controller 1310, system memory 1303, and one or more data storage devices 1311. The system memory 1303 includes at least one random access memory (RAM 1302) and at least one read-only memory (ROM 1304). All of these elements are in communication with a central processing unit (CPU 1306) to facilitate the operation of the computing device 1300. The computing device 1300 may be configured in many different ways. For example, the computing device 1300 may be a conventional standalone computer or, alternatively, the functions of computing device 1300 may be distributed across multiple computer systems and architectures. In FIG. 13, the computing device 1300 is linked, via network 1318 or local network, to other servers or systems.

The computing device 1300 may be configured in a distributed architecture, wherein databases and processors are housed in separate units or locations.

Some units perform primary processing functions and contain at a minimum a general controller or a processor and a system memory 1303. In distributed architecture embodiments, each of these units may be attached via the communications interface unit 1308 to a communications hub or port (not shown) that serves as a primary communication link with other servers, client or user computers and other related devices. The communications hub or port may have minimal processing capability itself, serving primarily as a communications router. A variety of communications protocols may be part of the system, including, but not limited to Ethernet, SAP, SAS™, ATP, BLUETOOTH™, GSM and TCP/IP.

The CPU 1306 comprises a processor, such as one or more conventional microprocessors and one or more supplementary co-processors such as math co-processors for offloading workload from the CPU 1306. The CPU 1306 is in communication with the communications interface unit 1308 and the input/output controller 1310, through which the CPU 1306 communicates with other devices such as other servers, user terminals, or devices. The communications interface unit 1308 and the input/output controller 1310 may include multiple communication channels for simultaneous communication with, for example, other processors, servers or client terminals.

The CPU 1306 is also in communication with the data storage device 1311. The data storage device 1311 may comprise an appropriate combination of magnetic, optical or semiconductor memory, and may include, for example, RAM 1302, ROM 1304, a flash drive, an optical disc such as a compact disc or a hard disk or drive. The CPU 1306 and the data storage device 1311 each may be, for example, located entirely within a single computer or other computing device, or connected to each other by a communication medium, such as a USB port, serial port cable, a coaxial cable, an Ethernet cable, a telephone line, a radio frequency transceiver or other similar wireless or wired medium or combination of the foregoing. For example, the CPU 1306 may be connected to the data storage device 1311 via the communications interface unit 1308. The CPU 1306 may be configured to perform one or more particular processing functions.

The data storage device 1311 may store, for example, (i) an operating system 1312 for the computing device 500; (ii) one or more applications 1314 (e.g., computer program code or a computer program product) adapted to direct the CPU 1306 in accordance with the systems and methods described here, and particularly in accordance with the processes described in detail with regard to the CPU 1306; or (iii) database(s) 1316 adapted to store information that may be utilized to store information required by the program.

The operating system 1312 and applications 1314 may be stored, for example, in a compressed, an uncompiled and an encrypted format, and may include computer program code. The instructions of the program may be read into a main memory of the processor from a computer-readable medium other than the data storage device 1311, such as from the ROM 1304 or from the RAM 1302. While execution of sequences of instructions in the program causes the CPU 1306 to perform the process steps described herein, hardwired circuitry may be used in place of, or in combination with, software instructions for embodiment of the processes of the present disclosure. Thus, the systems and methods described are not limited to any specific combination of hardware and software.

Suitable computer program code may be provided for performing one or more functions in relation to determining a decoding order of a SIC receiver as described herein. The program also may include program elements such as an operating system 1312, a database management system and "device drivers" that allow the processor to interface with computer peripheral devices (e.g., a video display, a keyboard, a computer mouse, etc.) via the input/output controller 1310.

The term "computer-readable medium" as used herein refers to any non-transitory medium that provides or participates in providing instructions to the processor of the computing device 1300 (or any other processor of a device described herein) for execution. Such a medium may take many forms, including, but not limited to, non-volatile media and volatile media. Non-volatile media include, for example, optical, magnetic, or opto-magnetic disks, or integrated circuit memory, such as flash memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM or EEPROM (electronically erasable programmable read-only memory), a FLASH-EEPROM, any other memory chip or cartridge, or any other non-transitory medium from which a computer may read.

Various forms of computer-readable media may be involved in carrying one or more sequences of one or more instructions to the CPU 1306 (or any other processor of a device described herein) for execution. For example, the instructions may initially be borne on a magnetic disk of a remote computer (not shown). The remote computer may load the instructions into its dynamic memory and send the instructions over an Ethernet connection, cable line, or even telephone line using a modem. A communications device local to a computing device 1300 (e.g., a server) may receive the data on the respective communications line and place the data on a system bus for the processor. The system bus carries the data to main memory, from which the processor retrieves and executes the instructions. The instructions received by main memory may optionally be stored in memory either before or after execution by the processor. In addition, instructions may be received via a communication port as electrical, electromagnetic or optical signals, which are exemplary forms of wireless communications or data streams that carry various types of information.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

The foregoing is merely illustrative of the principles of this disclosure and various modifications can be made without departing from the scope of the present disclosure. The above described embodiments of the present disclosure are presented for purposes of illustration and not of limitation, and the present disclosure is limited only by the claims which follow.

What is claimed is:

1. A method for encoding information using a code specified by a target Markov distribution, the method comprising:
   selecting a set of parameters comprising a block length, a plurality of weight metrics, and a threshold;
   estimating a Markov distribution associated with the selected set of parameters from a plurality of data blocks defined by the selected parameters;
   modifying the set of parameters based on the estimated Markov distribution; and
   encoding the information using the modified set of parameters.

2. The method of claim 1, further comprising:
   determining the set of parameters iteratively by repeatedly estimating a Markov distribution associated with the modified set of parameters and modifying the set of parameters based on the estimated Markov distribution.

3. The method of claim 1, wherein encoding the information using the modified set of parameters comprises:
   generating a trellis having a plurality of states based on the modified set of parameters; and
   encoding the information using an enumerative code determined from the trellis.

4. The method of claim 3, wherein the enumerative code comprises a look-up table, the method further comprising:
   compressing the look-up table to reduce an amount of storage associated with the look-up table.

5. The method of claim 3, wherein generating the trellis comprises:
   combining a subset of the plurality of states with similar characteristics.

6. The method of claim 1, wherein modifying the set of parameters based on the estimated Markov distribution comprises:
   modifying the set of parameters to approximate the target Markov distribution.

7. The method of claim 1, wherein the target Markov distribution is specified by a plurality of probabilities, and at least one of the plurality of probabilities corresponds to a hard constraint, the method further comprising:
   generating the plurality of data blocks such that each of the plurality of data blocks satisfies the hard constraint.

8. A system for encoding information using a code specified by a target Markov distribution, the system comprising:
   storage circuitry configured to store a set of parameters comprising a block length, a plurality of weight metrics, and a threshold; and
   control circuitry configured to:
      estimate a Markov distribution associated with the selected set of parameters from a plurality of data blocks defined by the selected parameters;
      modify the set of parameters based on the estimated Markov distribution, and
      encode the information using the modified set of parameters.

9. The system of claim 8, wherein the control circuitry is further configured to:
   determine the set of parameters iteratively by repeatedly estimating a Markov distribution associated with the modified set of parameters and modifying the set of parameters based on the estimated Markov distribution.

10. The system of claim 8, wherein the control circuitry encodes the information using the modified set of parameters by being further configured to:
    generate a trellis having a plurality of states based on the modified set of parameters; and
    encode the information using an enumerative code determined from the trellis.

11. The system of claim 10, wherein the enumerative code comprises a look-up table, and the control circuitry is further configured to:
    compress the look-up table to reduce an amount of storage associated with the look-up table.

12. The system of claim 10, wherein the control circuitry is further configured to generate the trellis by being configured to:
    combining a subset of the plurality of states with similar characteristics.

13. The system of claim 8, wherein modifying the set of parameters based on the estimated Markov distribution comprises modifying the set of parameters to approximate the target Markov distribution.

14. The system of claim 8, wherein the target Markov distribution is specified by a plurality of probabilities, at least one of the plurality of probabilities corresponds to a hard constraint, and the control circuitry is further configured to:
    generate the plurality of data blocks such that each of the plurality of data blocks satisfies the hard constraint.

15. A method for determining a Markov distribution code for use in a decoding system, the method comprising:
    modifying, using control circuitry, at least one probability value of a first Markov distribution to obtain a second Markov distribution;
    computing a performance metric for a code specified by the second Markov distribution based on properties of the decoding system;
    comparing the performance metric of the code specified by the second Markov distribution with a performance metric of a code specified by the first Markov distribution; and
    replacing the first Markov distribution with the second Markov distribution when the performance metric of the code specified by the second Markov distribution exceeds the performance metric of the code specified by the first Markov distribution.

16. The method of claim 15, further comprising:
    repeating the modifying, the computing, the comparing, and the replacing until a convergence criterion is satisfied.

17. The method of claim 15, wherein the performance metric corresponds to one or more values of an extrinsic information transfer function.

18. The method of claim 15, wherein the performance metric is associated with a shape of an extrinsic information transfer function.

19. The method of claim 15, wherein the first Markov distribution is associated with a code rate, and modifying the at least one probability value comprises:
    modifying the at least one probability value such that a code rate of the second Markov distribution remains equal to the code rate associated with the first Markov distribution.

20. The method of claim 17, wherein the extrinsic information transfer function is a first extrinsic information transfer function, and the method further comprises:
    selecting the one or more values to optimize a shape of the first extrinsic information transfer function in relation to a second extrinsic information transfer function.

* * * * *